(12) United States Patent
Fischer et al.

(10) Patent No.: US 8,344,258 B2
(45) Date of Patent: Jan. 1, 2013

(54) ELECTRIC DEVICE

(75) Inventors: Georg Fischer, Regensburg (DE);
Oliver Graf, Regensburg (DE);
Hans-Werner Motsch, Ingolstadt (DE)

(73) Assignee: Continental Automotive GmbH,
Hannover (DE)

( * ) Notice: Subject to any disclaimer, the term of this patent is extended or adjusted under 35 U.S.C. 154(b) by 273 days.

(21) Appl. No.: 12/936,018

(22) PCT Filed: Mar. 23, 2009

(86) PCT No.: PCT/EP2009/053342
§ 371 (c)(1),
(2), (4) Date: Oct. 1, 2010

(87) PCT Pub. No.: WO2009/121739
PCT Pub. Date: Oct. 8, 2009

(65) Prior Publication Data
US 2011/0017497 A1 Jan. 27, 2011

(30) Foreign Application Priority Data
Apr. 2, 2008 (DE) .......................... 10 2008 016 899

(51) Int. Cl.
*H05K 1/00* (2006.01)
(52) U.S. Cl. ........ 174/254; 174/251; 361/634; 361/752; 438/113; 324/750.2; 257/712

(58) Field of Classification Search .................. 174/254, 174/251; 361/634, 752; 438/113; 324/750.2; 257/712
See application file for complete search history.

(56) References Cited

U.S. PATENT DOCUMENTS

| 6,483,669 | B1 | 11/2002 | Krinke |
| 2003/0114022 | A1 | 6/2003 | Franzen et al. |
| 2006/0071325 | A1 | 4/2006 | Tanaka |
| 2009/0201699 | A1 | 8/2009 | Ohno |
| 2009/0229863 | A1 | 9/2009 | Fink et al. |

FOREIGN PATENT DOCUMENTS

| DE | 102006033477 B3 | 1/2008 |
| DE | 112006003139 T5 | 9/2008 |
| WO | 2007058045 A1 | 5/2007 |

*Primary Examiner* — Xiaoliang Chen
(74) *Attorney, Agent, or Firm* — Laurence A. Greenberg; Werner H. Stemer; Ralph E. Locher

(57) ABSTRACT

An electric device, in particular a mechatronic gear, motor, or brake control device in a motor vehicle, includes an electronic component having at least one electric contact surface for electrically contacting the component. A flexible circuit board with a conduction path structure includes at least one contact pad and conduction lines between two flexible, non-conducting films. A respective contact pad of the flexible circuit board is electrically connected, in particular by welding, to a respective contact surface of the component for creating at least one contact point. A sealing element is disposed on a side of the flexible circuit board opposite the component and an internal space is bounded by a wall. The sealing element is pressed against the flexible circuit board at an edge of the wall so that the edge surrounds at least one of the contact points.

20 Claims, 4 Drawing Sheets

ELECTRIC DEVICE

BACKGROUND OF THE INVENTION

Field of the Invention

The invention relates to an electric device, especially to a mechatronic gear, engine or brake control device for a motor vehicle.

Electronic components of a control device in a motor vehicle must be protected against environmental influences, such as moisture for example. Control devices are used for example to control a transmission in a motor vehicle. In recent times a trend has emerged towards integration of the control electronics and the associated sensor systems into the transmission. This is referred to as a mechatronic transmission control device. There are also trends for such "in-situ electronics" in other areas of application, such as engine control devices or brake control devices for example.

With mechatronic control devices flexible printed circuit boards, known as flex boards, are used for distributing electrical signals and currents. With a flexible circuit board a conduction path structure is arranged between two flexible, non-conducting foils (e.g. made of polyimide). The conduction path structure and the conducting foils are mechanically connected to each other via an adhesive layer. The conduction path structure comprises contact pads as a well as conduction lines via which electrical contact will be established to a contact partner. In the area of the contact pads the flexible circuit board is opened up to one side by the corresponding cutouts being made in one of the two foils. The metallization of the conduction path structure revealed in the area of the contact pad or contact pads makes electrical contacting to a contact partner possible, such as a leadframe for example, a pin or a contact surface of a component.

The electrical connection between the contact pads of the conduction path structure of the flexible circuit board and contact surfaces of the contact partner is established for example using a laser weld connection. In such cases the other of the two films of the flexible circuit board is damaged in the area of the contact point(s) which means that the conduction path structure is unprotected. If such a control device is now used in a transmission, it has oil washing around it. Small metal particles, which have not been entirely removed during the manufacturing of the transmission and also wear to the gear wheels of the transmission or oil sludge can under some circumstances result in an electrical connection between two of the now unprotected contact points being established, meaning that a short circuit is possible. Because of the manufacturing process described, the film of the flexible circuit board cannot provide protection for all lines and contacts from metallic particles to be found in oil.

BRIEF SUMMARY OF THE INVENTION

The object of the present invention is thus to specify an electric device, especially a mechatronic gear, engine or brake control device in a motor vehicle, for which improved protection is guaranteed for open contact points against conductive particles.

The object is achieved by an electric device with the following features:

An inventive electric device comprises an electronic component having at least one electrical contact surface for electrical contacting of a component. The concept of an electronic component is a wide-ranging one here. An electronic component within the meaning of the invention not only includes electronic chips such as sensors and actuators for example, but also typically circuit carriers.

The electric device further features a flexible printed circuit board in which a conduction path structure with at least one contact pad and conduction lines is arranged between two flexible, non-conducting films, whereby, to embody a contact point, a respective contact pad of the flexible circuit board is electrically connected to a respective contact surface of the component, especially by welding. This type of flexible circuit board, as already explained above, is known as a flex board. In particular the films embedding the conduction path structure are made of a flexible plastic, especially polyimide. A flexible printed circuit board thus differs from a conventional circuit board in its flexibility as well as the constructional design of its layers.

The inventive electric device also comprises a sealing element which is arranged on a side of the flexible printed circuit board opposite the component and has an interior space bounded by walling, with the sealing element being pressed against the flexible circuit board at an edge of the walling so that the edge surrounds at least one of the contact points.

With an inventive electric device the problem of providing the necessary seal against swarf and particles is solved by providing a seal element which prevents an electrical connection (short circuit) being established between two contact points of the electric device as a result of swarf or electrically-conducting foreign body particles. In such cases the inventive electric device has the advantage of being able to be produced in a simple and low-cost way. Furthermore an inventive electric device with a sealing element insures that the load on the electrical contact points is minimized. This enables a comparatively long life of the contact connections to be guaranteed, compared to a version of the electric device with no swarf and particle protection.

In particular the walling is embodied as double walling and has an outer side wall and an inner side wall adjoining the interior space, with a section of the walling connecting the outer and the inner side wall embodying the edge. The double-wall design provides increased stability for the sealing element. In particular a transverse movement of the sealing element relative to a plane of the flexible circuit board can be easily accommodated. In addition a wider seal section which is in contact with the circuit board is provided, whereby the sealing effect is improved.

Expediently a groove is embodied in the wall between the outer side wall and the inner side wall. The result of this is that the edge of the walling pressed against the flexible circuit board is formed by two sealing lips separated by the groove, which together represent a double barrier for the intrusion of swarf and particles into the interior space.

Expediently the interior space comprises one or more chambers which are embodied by a respective inner side wall, with a respective chamber being provided for sealing a contact point. In particular the outer side wall forms common walling surrounding the inner side walls of the chambers. In such cases the outer side wall insures that swarf and/or particles cannot get into the interior space, i.e. into one of the chambers, of the sealing element. The respective inner side walls, if there are still particles in one of the chambers, prevents them being able to form an electrically-conducting connection between two contact points. This is achieved by the respective inner side walls of the chambers sealing the contact points having to be overcome between respective contact points. A groove is also embodied between the inner side walls.

To achieve a good seal as well as less stressful and damaging effects on the electrical contact connections there is provision for embodying the sealing element from a reversibly deformable plastic, especially an elastomer.

There is also provision for fixing the sealing element in a surrounding frame made from an essentially non-deformable material. Especially only the outer side wall should be fixed by the frame in such cases. One the one hand this achieves good contact between the sealing element and the flexible circuit board. On the other hand the sealing element is able to be moved a certain amount in relation to the frame so that tolerances can be allowed for.

In a further embodiment the frame features a plurality of latching elements with which the frame is fitted in a non-destructively detachable way to a first housing component or into a recess of the first housing compartment corresponding to the frame. The pressure necessary for sealing with which the sealing element is pressed against the flexible circuit board is thus generated by the frame.

The dimensions of the frame and the recess are expediently selected such that the frame is supported movably in the recess in parallel to the plane of the flexible circuit board within predetermined limits. This enables friction forces between the sealing element and the flexible circuit board to be avoided which can lead to damage to the contact point or to the conduction path structure because of "rubbing".

In particular the sealing element is fixed in parallel to the plane of the flexible circuit board relative to the flexible circuit board. In this embodiment the component coupled electrically and/or mechanically to the flexible circuit board can control the movability of the sealing element. Such an arrangement is also referred to as a "fully floating seal".

In accordance with a further embodiment a section of the frame substantially located in the plane of the base of the sealing element is solely provided for accommodating a force acting at right angles to the plane of the flexible circuit board. This enables the base of the sealing element to move at right angles to the plane of the base within predetermined limits and thereby compensate for tolerances during production. The frame or the respective frame section are thus used as a support for the frame-fixed sealing element.

In this case it is also expedient for a gap of a given height to be embodied between the base of the sealing element and the first housing component. This allows an individually adjustable two-stage pressure force of the sealing element to be set on the flexible circuit board. The pressure force is two-stage because initially a deformation of the sealing element in the gap can occur. Consequently a deformation of the sealing element itself occurs which is easily possible because of the flexible characteristics of the elastomer. In this case the sealing force can be set on the basis of the gap width and the cross-sectional embodiment and the material properties of the sealing element.

The seal formed between the flexible circuit board and the sealing element is embodied at least particle-tight. This means that the seal does not need to be embodied oil or fluid-tight. The proposed electric device ensures however that short-circuits between respective contact points are prevented or at least minimized.

In accordance with a further concrete embodiment the component is attached by its main surface facing away from the at least one contact surface to a second housing component. In this case the first and the second housing component are mechanically connected to one another In particular the inventive device is intended for attachment in an oil or fluid bath. The inventive electric device can for example be embodied as an electronic gear control device, as an engine or as a brake control device for use in a motor vehicle.

BRIEF DESCRIPTION OF THE SEVERAL VIEWS OF THE DRAWING

The invention will be explained in greater detail below with reference to the drawings. The drawings show.

DESCRIPTION OF THE INVENTION

Figure 1:
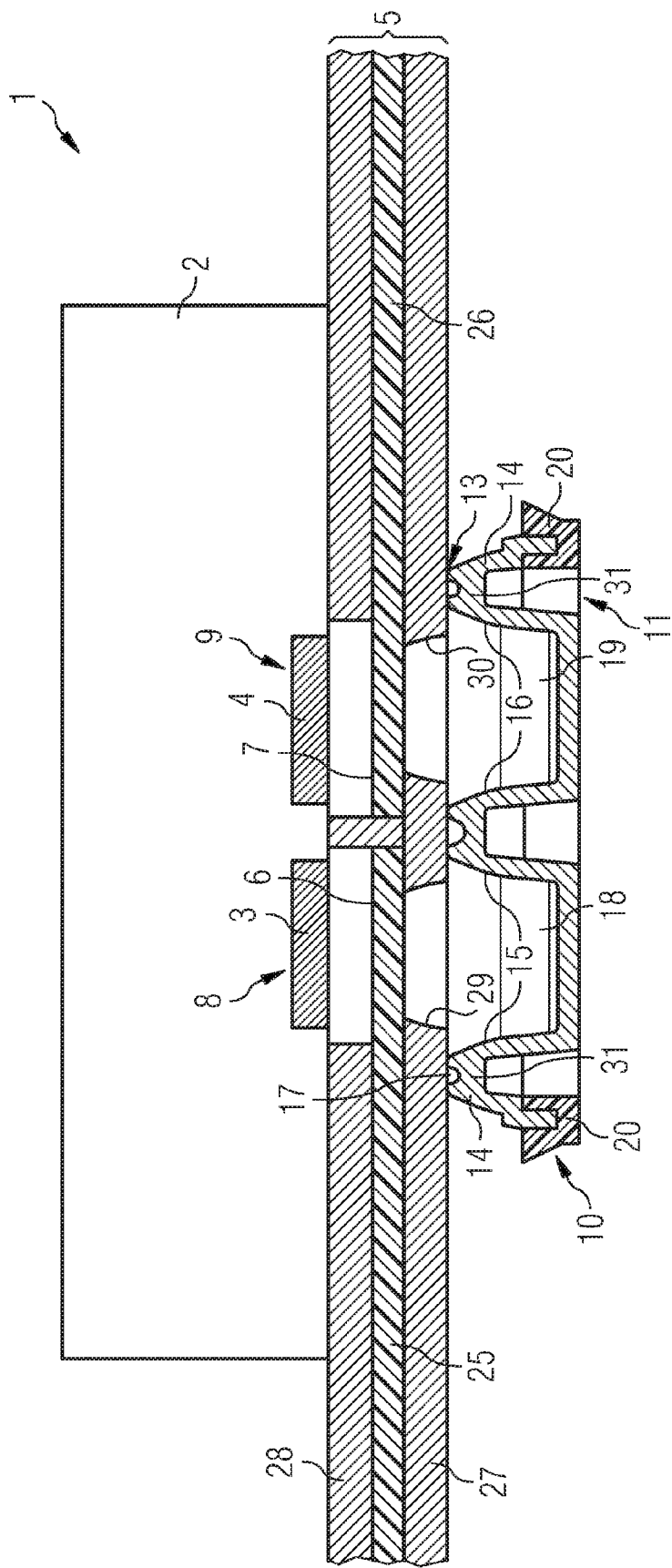
FIG. 1 a cross-sectional view of a part of an inventive electric device.

FIG. 1 shows a schematic cross-sectional diagram of a part of an inventive electric device 1. The inventive electric device 1 can represent a mechatronic gear control, an engine control or a brake control in a motor vehicle for example. The electric device 1 comprises an electronic component 2, e.g. a sensor or a semiconductor component. In the exemplary embodiment the component 2 comprises two contact surfaces 3, 4 which are embodied on a main side of the component 2. The component 2 is electrically and mechanically connected via the contact surfaces to a flexible circuit board 5. The flexible circuit board 5 is referred to as a flex board and comprises a conduction path structure with conduction lines 25, 26 and contact pads 6, 7. The conduction path structure is arranged between two films 27, 28 consisting of insulating material. The contact pads 6, 7 are made electrically accessible by inserting openings into the film 28. Because of the small thicknesses of the films 27, 28 and the contact surfaces 3, 4 which may project beyond the main side, a direct electrical contacting of the contact pads with the corresponding contact surfaces 3, 4 is possible.

An electrical connection between the contact surfaces 3, 4 of the component 2 and the contact pads 6, 7 of the conduction path structure of the flexible circuit board 5 is especially established by laser welding. When the welding process is undertaken from a side of the circuit board 5 lying opposite the component 2, energy is introduced through the film 27 in the area of the contact points 8,9 to be established in order to weld the contact pads 6 to the contact surface 3 or to weld the contact pads 7 to the contact surface 4. The energy input into the film 27 in the area of the contact points 8, 9 produces unintentional but destructive openings 29, 30 in the film 27.

While the contact points 8, 9 are sealed against the intrusion of particles or swarf from the side of the component 2 for constructional reasons because the component 2 rests against the circuit board 5, the conduction path structure is electrically accessible from the opposite side in the area of the openings 29, 30. As a result of this, because of the arrangement of the electric device (e.g. in an oil bath) swarf or particles which arise for reasons such as wear to mechanical components can be present on the contact pads 6, 7 in the openings 29, 30. Under unfavorable circumstances in this case an electrical path can be established between the contact pads 6, 7. The functional capabilities of the electric device can be adversely affected by this.

To avoid the buildup of swarf and/or particles on the contact pads 6, 7 in the area of the openings 29, 30 of the flexible circuit board, a sealing element 10 made from a reversibly-deformable plastic, especially an elastomer, is therefore provided. The sealing element 10 is shown on its own in a cross-sectional view in FIG. 2 and in a perspective view in FIG. 3. In the exemplary embodiment the sealing element 10 has two chambers 18, 19. Each chamber, as can be seen especially well from FIG. 3, is formed by an inner wall 15 or 16 and a base 22 or 23. The inner side walls 15, 16 are also surrounded by an outer side wall 14. In the area of an edge 13 of the sealing element 10 adjoining the flexible circuit board 5 the outer side wall 14 and the inner side walls 15, 16 are connected to one another by a section of material 31 in each case. In the cross-sectional diagrams of FIG. 1 and FIG. 2 a groove 17 is thus produced in each case in the edge 13 between the outer side wall 14 and the inner side walls 15, 16. This causes the sealing element to rest tightly with the respective outermost ends of the outer side wall 14 and the inner side walls 15, 16 on the flexible circuit board 5, with these outermost ends or sections forming sealing lips.

In accordance with the exemplary embodiment depicted in FIG. 1 a chamber 18, 19 is provided for each contact point 8, 9 in each case. This provides an optimum protection against a short circuit between the contact points 8, 9. The outer side wall 14 initially prevents swarf and/or particles in the oil bath being able to reach any of the contact points 8, 9. Naturally those sections of the inner side walls 15, 16 which run substantially in parallel to the outer side wall 14 also contribute to this. The provision of the inner side walls 15, 16 also ensures that any swarf and/or particles which may be present in the interior of one of the chambers and 18, 19 are not able to form electrical conductors in the direction of the other chamber and thereby the contact point.

In a version departing from this exemplary embodiment there could also however be provision for a number of contact points to be assigned to a respective chamber of the sealing element.

Figure 2:
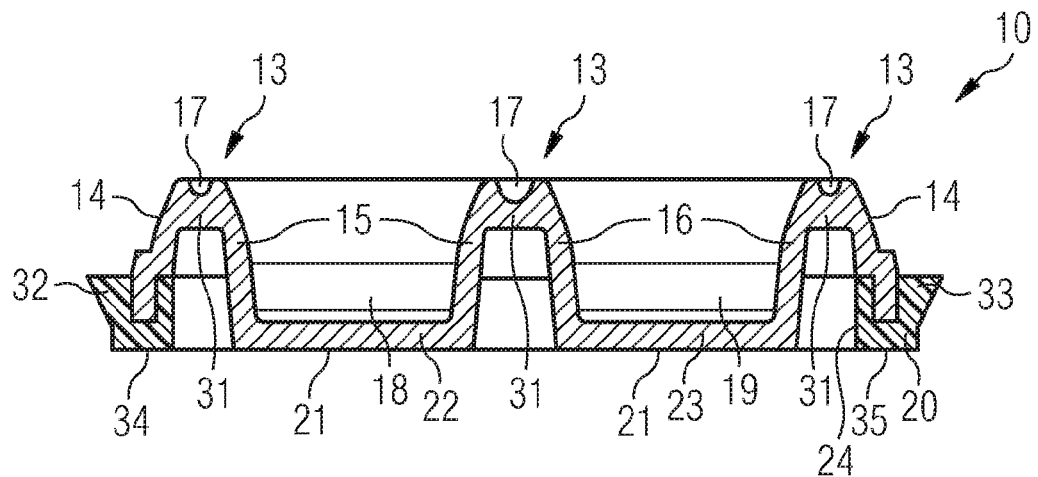
FIG. 2 a cross-sectional view of an inventive sealing element which is fixed in a frame, FIG. 3 a perspective view of the sealing element shown in FIG. 2, FIG. 4 a cross-sectional view of the sealing element arranged in a housing component, FIG. 5 a further cross-sectional view showing a section of an inventive electric device in which contact points are protected by the sealing element, and FIG. 6 a part perspective view of a further electric device in which the sealing element is supported fully floating.
Figure 3:
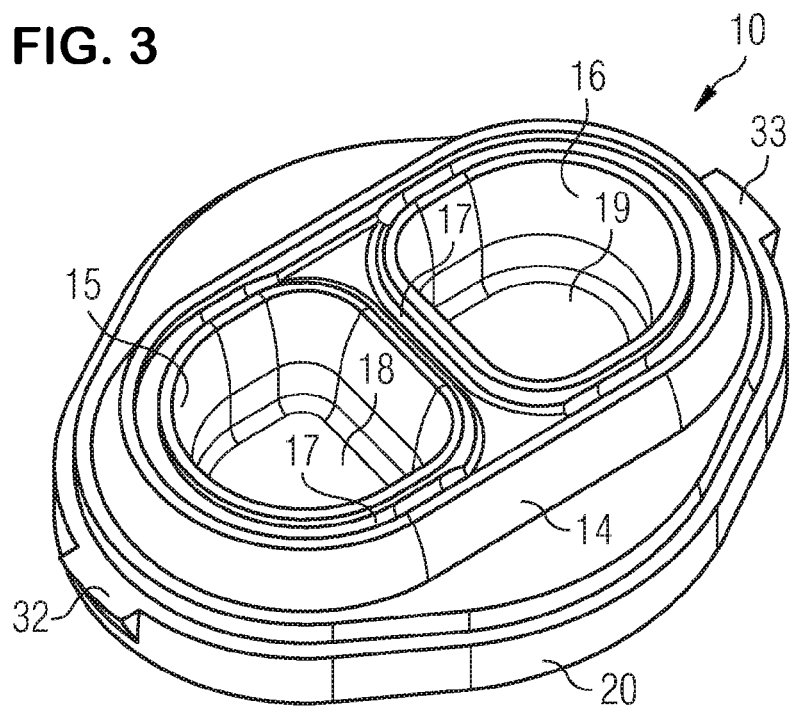

As can be easily seen from FIGS. 1, 2 and 3, the outer side wall 14 of the sealing element 10 is fixed by its end facing away from the circuit board 5 in a frame 20. The frame 20 is formed from an essentially non-deformable material, preferably plastic. The frame 20 has latching elements 32, 33 on two opposing main sides with which the frame and thereby the sealing element 10 can be fixed to a housing component. It can also be seen from the cross-sectional diagrams of FIGS. 1 and 2 that the frame 20 has a recess 24. The chambers 18, 19 of the sealing element 10 project into the recess 24. The base 21 of the sealing element or the bases 22, 23 of the Chambers 18, 19 lie approximately in the same plane as an underside of the frame which embodies frames support sections 34, 35.

Figure 4:
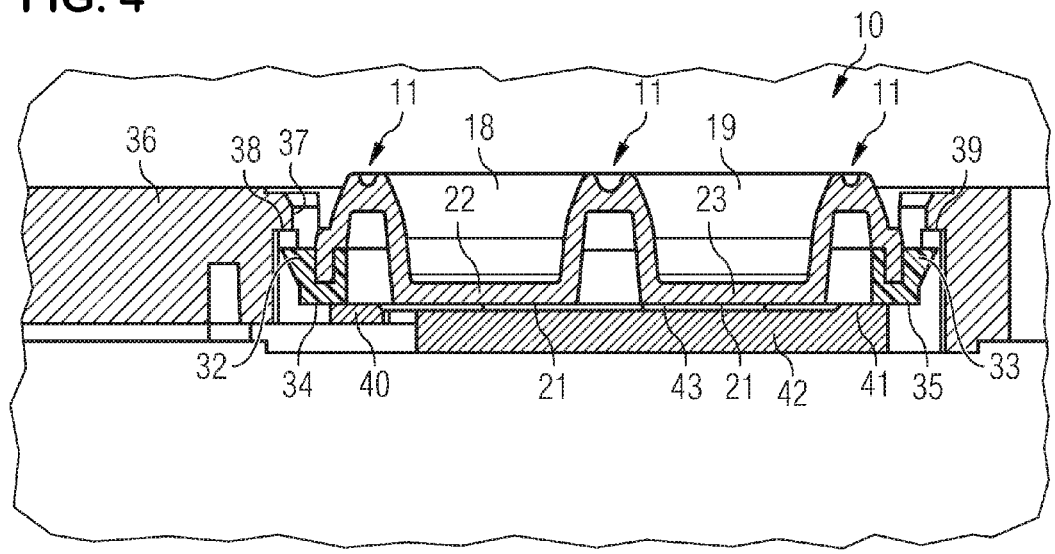

The way in which the sealing element shown in FIGS. 2 and 3 and fixed to the frame 20 is arranged in a first housing component 36 of the electric device 1 can be seen from FIG. 4. The housing component 36 features a recess 37 which corresponds to the shape of the sealing element 10 or of the frame 20. The dimensions of the frame 20 and the dimensions of the recess 37 of the first housing component 36 are selected such that the frame 20 is supported in the recess 37 in parallel to the plane of the flexible circuit board to allow movement within predetermined limits. This prevents a transverse movement of the sealing lips, i.e. the ends of the outer and inner sidewalls 14, 15, 16 adjoining the circuit boards. As a result of this, fewer stressful and damaging effects are exerted on the electrical contact connections. The gap formed in the lateral direction between the frame 20 and the recess 37 is all around the circumference in such cases in order to achieve part "floating" of the sealing element 10.

When the sealing element 10 (provided with the frame 20) is inserted, the latching elements 30 to 33 which expand upwards, are slightly deformed. In this case the latching elements 32, 33 are moved towards one another. After passing the constriction which is embodied by shoulders 38, 39 the frame 20 changes its form back in the area of the latching elements 32, 33. Because of the latching elements 32, 33 provided on the frame 20, the sealing element 10 has a width which is larger than the width of the recess 37 on its upper side in the area of the shoulders 38, 39. As a result of this the sealing element 10 is fixed by the frame 20 in the recess 37 whereby, because of a gap between the upper edge of the latching elements 32, 33 and the shoulders 38, 39, slight play is provided. With the underside of the frame, i.e. the frame contact sections 34, 35, the frame 20 lies against contact sections 40, 41 of the housing component 36. Between the base 21 of the sealing element (i.e. the bases 22, 23 of the chambers 18, 19) and the base 42 of the recess 37 a gap 43 is formed so that the sealing element 10 can deform on application of a slight force from above until the base 21 is in contact with the base 42 of the recess 37. A further application of force to the walling 11 of the sealing element 10 leads to a deformation of the sealing lips and of the outer and inner side walls 14, 15, 16, with these curving outwards because of their design. Through this design an individually-adjustable two-stage pressure force on the sealing element can be set.

Figure 5:
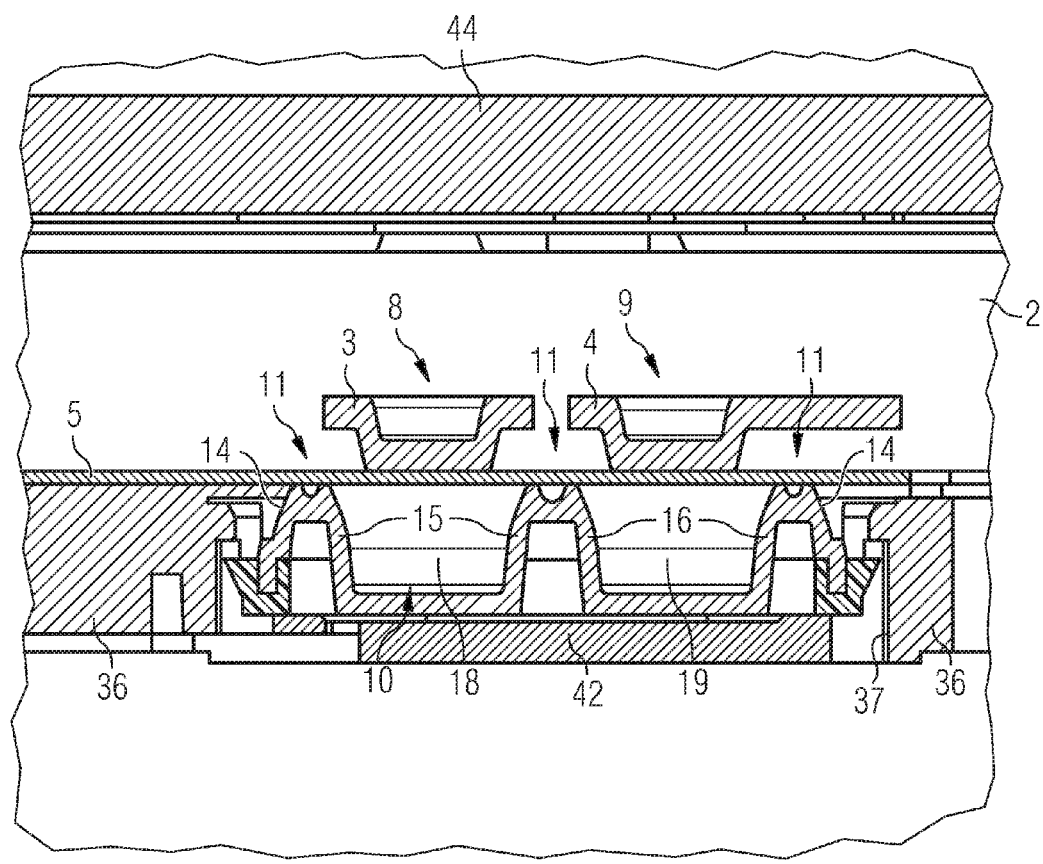

FIG. 5 shows, in a further partly cross-sectional diagram of the inventive electrical device, the flexible circuit board 5 adjoining the sealing element 10 with the component 2 welded to it. It can also be seen from FIG. 5 that the component 2 is attached on or to a further housing component 44. The first housing component 36 and the second housing component 44 of the electrical device 1 are connected mechanically to each other for example via a latching connection or the like. The connection of the first and second housing component 36, 44 presses the flexible circuit board against the walling 11 of the sealing element 10, so that the desired seal against intrusion of particles and/or swarf is provided. Depending on the force with which the flexible circuit board 5 is pressed onto the sealing element 10, a deformation of the sealing element 10 in the direction of the base 42 of the recess 37 occurs. If necessary a deformation of the walling 11 of the sealing element 10 also occurs.

It should be stressed that no seal is to be achieved by the inventively provided sealing element which is intended to or must prevent the intrusion of oil or another fluid into the chambers 18 or 19. Instead it is sufficient for the seal embodied between the flexible circuit board 5 and the sealing element 10 to be particle-tight. This is based on the knowledge that an electrically-conductive path is able to be formed by a plurality of particles touching one another, which in the worst case could give rise to a short circuit. The purpose of the seal is thus to suppress an electrically-conducting path between contact points of the flexible circuit board on the side of the flexible circuit board opposite to a component.

Figure 6:
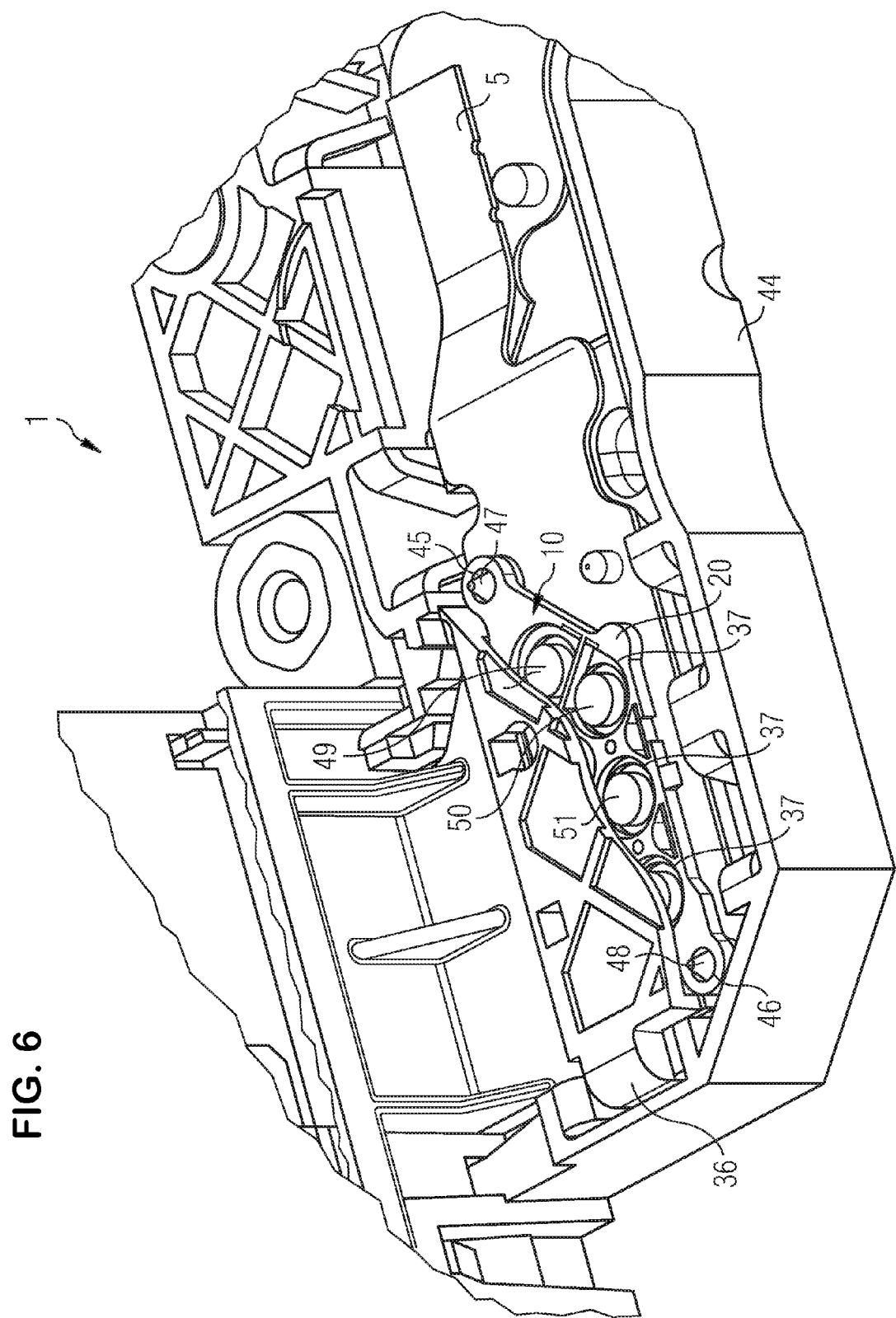

FIG. 6 shows a further exemplary embodiment in a perspective view of a part of an electric device 1. In this case the arrangement of component 2 (not visible in the figure), flexible circuit board 5 and sealing element 10 is disposed between two joined housing components 36, 44. This diagram shows the design of the frame 20 very well, which has two holes 45, 46 on opposing outer ends, into which the pins 47, 48 of the housing component 44 project. The pins 47, 48 likewise fix the flexible circuit board 5 in this case. This enables the component fixed to the flexible circuit board 5 and the housing component 44 (not visible in the figure) to control the movement of the sealing element 10 in the housing component 36. To achieve this movement, a gap running around the circumference is once again embodied between the frame 20 and a corresponding recess of the housing component 44 not shown in the figure.

Protecting open contact points against conductive particles such as swarf or the like is effected within the framework of the invention by a sealing element made of an elastomer. The sealing element is constructively similar to a "bellow seal". The sealing element is embodied such that exertion of axial and radial forces on the contact points is avoided. The exertion of radial forces is avoided or minimized by the constructive design of the sealing element and a floating supported latching. Avoiding the exertion of axial forces is realized by the two-stage force graduation in the form of the recess of the housing component into which the sealing element is inserted.

The invention claimed is:

1. An electric device, comprising:
   an electronic component having at least one electrical contact surface for electrical contacting of said electronic component;
   a flexible circuit board having a side facing said electronic component, a side facing away from said electronic component, two flexible, non-conductive films, a conduction path structure disposed between said two flexible, non-conductive films and having at least one contact pad and conduction lines, each said at least one contact pad of said flexible circuit board being electrically connected to a respective said at least one electrical contact surface of said electronic component to provide at least one contact point; and
   a sealing element disposed at said side of said flexible circuit board facing away from said electronic component and having a walling, said walling delimiting an interior space and having an edge pressed onto said flexible circuit board and surrounding said at least one contact point.

2. The device according to claim 1, wherein the electric device is a mechatronic gear or an engine or brake control device for a motor vehicle.

3. The device according to claim 1, wherein each said at least one contact pad is electrically connected to a respective said at least one electrical contact surface of said component by a weld.

4. The device according to claim 1, wherein said walling is doubled and includes an outer side wall and an inner side wall adjoining said interior space, said walling having a section connecting said outer and inner side walls to form said edge.

5. The device according to claim 4, wherein said edge has a groove formed therein between said outer side wall and said inner side wall.

6. The device according to claim 4, wherein said interior space includes at least one chamber each formed by a respective inner side wall, and said at least one chamber each seals a respective said at least one contact point.

7. The device according to claim 6, wherein said outer side wall forms said walling enclosing said inner side walls of said at least one chamber in common.

8. The device according to claim 1, wherein said sealing element is formed of a reversibly deformable plastic or elastomer.

9. The device according to claim 1, which further comprises a surrounding frame made of a substantially non-deformable material, said sealing element being fixed in said surrounding frame.

10. The device according to claim 9, wherein said walling is doubled and includes an outer side wall and an inner side wall adjoining said interior space, said walling having a section connecting said outer and inner side walls to form said edge, and only said outer side wall is fixed by said frame.

11. The device according to claim 9, which further comprises a base further delimiting said interior space of said sealing element, said frame being recessed in vicinity of said base.

12. The device according to claim 10, which further comprises a first housing component having a recess formed therein corresponding to said frame, said frame having a plurality of latching elements attaching said frame, in a non-destructive releasable manner, to said first housing component or in said recess of said first housing component.

13. The device according to claim 12, wherein said frame and said recess have dimensions configured to permit said frame to be supported in said recess parallel to a plane of said flexible circuit board allowing movement within predetermined limits.

14. The device according to claim 13, wherein said sealing element is fixed relative to said flexible circuit board in parallel with the plane of the flexible circuit board.

15. The device according to claim 11, wherein said frame has a section substantially lying in a plane of said base of said sealing element and being solely provided for accommodating a force acting at right angles to the plane of said flexible circuit board.

16. The device according to claim 12, which further comprises a base further delimiting said interior space of said sealing element, said frame being recessed in vicinity of said base, and said base of said sealing element and said first housing component defining a gap therebetween.

17. The device according to claim 1, wherein said sealing element creates a seal with said flexible circuit board being at least particle-tight.

18. The device according to claim 12, which further comprises a second housing component, said electronic component having a main side facing away from said at least one contact surface and being attached to said second housing component.

19. The device according to claim 18, wherein said first and second housing components are mechanically connected to one another.

20. The device according to claim 1, wherein the device is configured for attachment in an oil or fluid bath.

* * * * *